United States Patent [19]

Giebel

[11] Patent Number: 4,502,131
[45] Date of Patent: Feb. 26, 1985

[54] ELECTRICALLY PROGRAMMABLE MEMORY MATRIX

[75] Inventor: Burkhard Giebel, Denzlingen, Fed. Rep. of Germany

[73] Assignee: ITT Industries, Inc., New York, N.Y.

[21] Appl. No.: 530,528

[22] Filed: Sep. 9, 1983

[30] Foreign Application Priority Data

Sep. 22, 1982 [EP] European Pat. Off. ........ 82108757.4

[51] Int. Cl.³ ............................................. G11C 29/00
[52] U.S. Cl. ...................................... 365/201; 371/21
[58] Field of Search .............. 365/174, 182, 189, 201, 365/230; 371/21

[56] References Cited

U.S. PATENT DOCUMENTS 4,419,747  12/1983  Jordan ................................. 365/201

Primary Examiner—Terrell W. Fears
Attorney, Agent, or Firm—Donald J. Lenkszus

[57] ABSTRACT

An electrically programmable memory includes a test circuit usable for detection of interaction between adjacent memory cells by easily permitting a checkerboard-pattern to be programmed into the memory.

9 Claims, 3 Drawing Figures

ELECTRICALLY PROGRAMMABLE MEMORY MATRIX

BACKGROUND OF THE INVENTION

In memory cells for use with memory matrices of the type employing an electrically floating gate such as described in "Electronics" of Feb. 28, 1980, pp. 113 through 117, faulty insulating layers, for example, between the control gate and the storage gate and between the regions and the storage gate, may lead to unintended reprogrammings because of excessive leakage currents. Therefore, the memory cells must be subjected to a test following manufacture such as described in DE-OS No. 30 30 852 and the published documents of the application WO No. 82/00154. These publications pertain to testing methods for an electrically programmable memory matrix employing "n" row selecting lines via which "m" memory cells are capable of being selected, and which are connected to each time one of "n" outputs of a row decoder having "a" input terminal pairs according to the relationship $n = 2^a$. Into the row decoder, depending on the mode of operation, are fed a ground potential Vo which is approximately zero potential, a supply potential Vcc of about 5 V, and a programming potential Vp of e.g., 25 V. For conventional types of programmable memory matrices during normal operation (writing, erasing, reading), first input signals are each applied to one terminal of the "a" input terminal pairs of the row decoder and second input signals which are complementary to the first input signal are each applied to the other terminal of each pair.

For test operations, each of the "a" address amplifiers supplying the input terminal pairs includes an additional activating terminal to which an activating signal level is applied for test actuation. When the activating signal level is applied, all row selecting lines are capable of being switched to a high level necessary for the programming.

The application WO No. 81/00154 proposes to carry out a test operation by applying a test voltage simultaneously between the control gate and the source of each memory transistor during a certain period of time. According to the test method disclosed in DE-OS No. 30 30 852, it is proposed to passivate the address amplifiers by means of the additional circuit, so that all row selecting lines are simultaneously capable of being switched to the level necessary for the programming operation, to feed the programming voltage into the decoder and, finally, to test in the course of a reading process following the test, whether reprogramming has taken place in the memory cells due to a leakage current mechanism.

Accordingly, with the aid of the conventional additional circuits, it is possible to carry out a test operation in which all memory cells can be subjected to a programming operation or can be simultaneously subjected to a voltage loading with the effects thereof being measured during a subsequent reading operation. Individual testing of the memory cells with respect to leakage points is practically out of the question because of the unbearable long testing time which would be required.

The conventional additional circuit for testing a memory matrix has the disadvantage that cells lying next to each other cannot be tested with respect to a mutual influencing or interaction.

SUMMARY OF THE INVENTION

In accordance with the invention a memory matrix is provided which employs a simple additional circuit that permits checking the mutual influence of differently programmed neighbouring cells without substantially extending the testing time.

Further, in accordance with the invention, the circuit permits use of chessboard-pattern programming which is particularly suitable for checking a memory cell matrix as to whether it is free from defects.

BRIEF DESCRIPTION OF THE DRAWING

The invention may be better understood from a reading of the following detailed description in conjunction with the drawing, in which.

DETAILED DESCRIPTION

Figure 1:
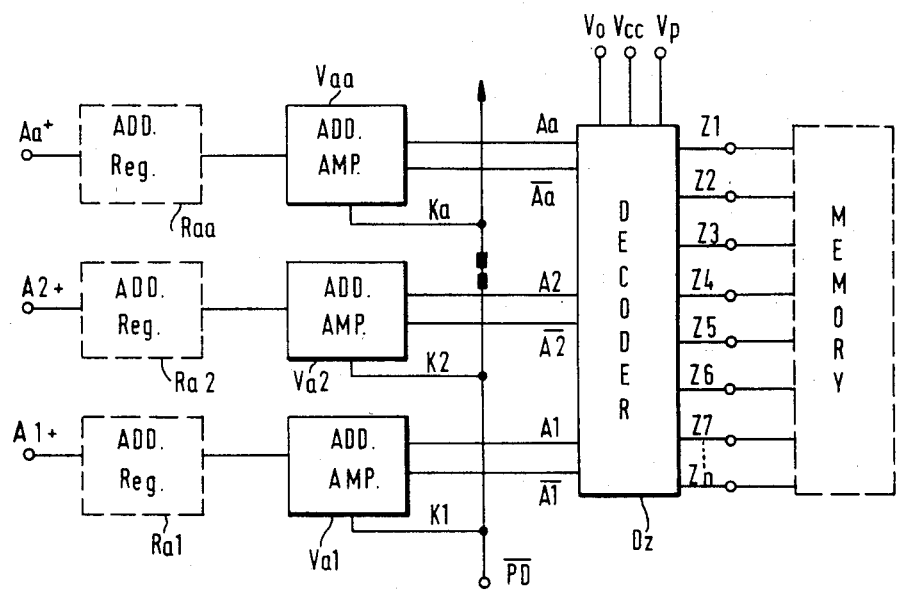
FIG. 1 is a block diagram of the conventional memory matrix circuit to which the invention may be applied.

FIG. 1 shows the row decoder Dz in the form of a simple NOR gate whose circuit differs from the decoder circuit referred to as a column decoder and shown in FIG. 7 of the aforementioned documents of the patent application WO No. 81/00254, in that the transistor T15 is replaced by a short circuit. The decoder comprises "n," outputs Z1 through ZA which are connected to the corresponding number of row selecting lines. During the active reading, writing and erasing modes of operation, all outputs of the row decoder Dz, with the exception of one selected output, are connected to a potential Vo corresponding to a "low level."

The decoders Dz of the memory matrices according to the invention, are controlled by "a" address amplifiers Va1 through Vaa with "a" being related to "n" according to the relationship $n = 2^a$. The address amplifiers supply pairs of complementary output signals e.g., A1, $\overline{A1}$, as can be seen from the drawings. The address amplifiers Ca1 through Vaa can each be controlled or selected by one of "a" address registers Ra1 through Raa indicated by the dashlines in the drawings, into which is fed one bit A1+, A2+, A3+ of the storage address. Each of the aforementioned address amplifiers Va1 through Vaa comprises one of the activating terminals K1 through Kn to which the actuation signal $\overline{PD}$ may be applied. The address amplifiers Va1-Va3 are of conventional design and are activated, i.e., transmit complementary control signals, as soon as the activating signal $\overline{PD}$ is at the high level H. The activating signal, at the same time, distinguishes an inactive current-saving operation of the entire memory circuit, from the active mode of operation.

During the "inactive" mode of operation, however, all outputs of the address amplifiers are connected to a low potential Vo. Accordingly, during the inactive mode of operation all input terminals of the row decoder Dz, receiving the output signals A1, $\overline{A1}$; ...; Aa, $\overline{Aa}$ of the address amplifiers Va1 through Vaa, are at a low level, which causes all output signals of the decoder to be at a high level.

To obtain the chessboard-pattern programming in accordance with the invention, rows with even ordinal numbers (Z2, Z4, . . . ) and rows with odd ordinal numbers (Z1, Z3, . . . ) must be differently programmed in the bit pattern; within these groups, however, the bit pattern along the row is alike. Therefore, the row decoder Dz must be activated in such a way that functionally either all even or all odd rows are selected. This mode of operation should not be selectable during normal operation, but only during a testing mode of operation.

Figure 2:
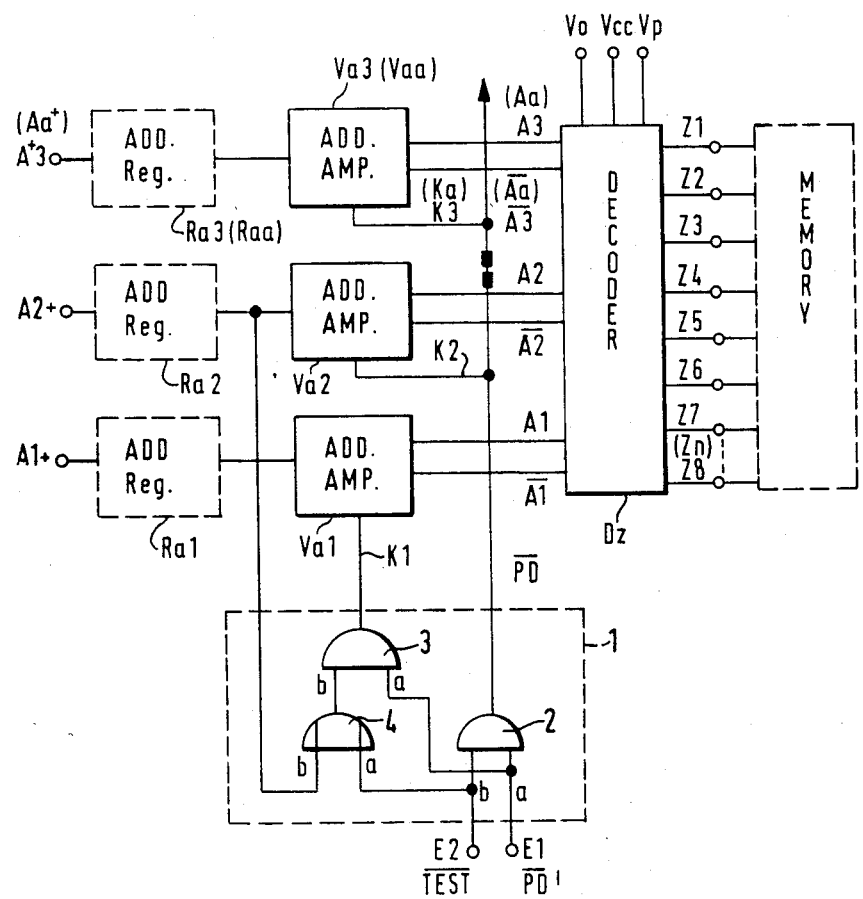
FIG. 2 is a block diagram of the memory matrix circuit according to the invention, together with the additional circuit for carrying out chessboard-pattern programming.

According to the invention, the address amplifiers for the test mode of operation, are switched over in their function by a logic circuit 1 as shown in FIG. 2. Logic circuit 1 has a first input E1 connected to the first input a of a first AND gate 2 and to the first input a of a second AND gate 3. Circuit 1 has a second input E2 connected to the second input b of the first AND gate 2 and to the first input a of an OR gate 4 whose output is connected to the second input b of the second AND gate 3. The output of the second AND gate 3 is connected to the activating terminal K1 of the one of amplifier Va1, while the output signal of the first AND gate 2 is applied to the activating terminals K1, K3 of the remaining address amplifiers Va2, Va3. The input of one of the remaining address amplifiers is connected to the second input b of the OR gate 4. In the embodiment as shown in FIG. 2 comprising an 8-bit row decoder, the second input b of the OR gate 4 is connected to the input of the address amplifier Va2. In this particular case a row selecting pattern with the period 2 (even-/odd) is achievable.

Figure 3:
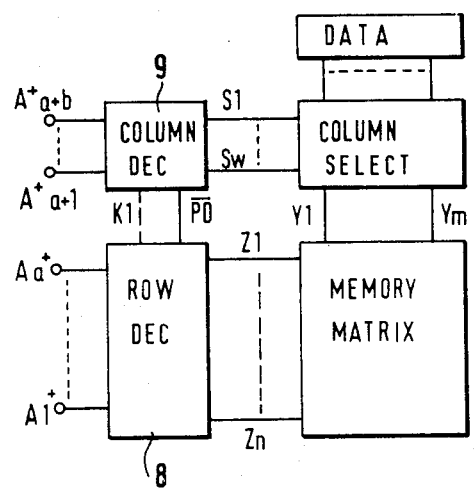
FIG. 3 illustrates the memory matrix circuit in conjunction with a memory matrix.

In cases where a column or a block decoder is provided for distinguishing several storage bytes along one row then, these decoders may also be provided with even/odd selecting capability analogous with the aforedescribed design of the row decoder. As a rule, however, and for achieving a chessboard-pattern, it is sufficient to simultaneously provide the selecting capability for all columns or blocks by address signals analogous to those of the address amplifiers Va2, Va3. The bit pattern is then still determined only by the potentials of the data lines, hence by the memory input data. As shown in FIG. 3, row address and decoder circuit 8 is the circuit of FIG. 2 and the column address and decoder g is substantially identical to that of FIG. 1.

Accordingly, in an electrically programmable memory matrix according to the invention, upon application of a logic low or "L" $\overline{TEST}$ signal to E2 and the following programming operation, there is effected a simultaneous programming of several memory rows with the same bit pattern along each row, when the respective outputs of the row decoder Dz conduct the programming potential Vp. The simultaneous selection of several decoders is accomplished in that all address signals at the outputs of the address amplifiers which control the respective decoders are applied to the low-level potential Vo. Such a low-level signal Vo as applied to all inputs of all decoders, however, is already provided for the inactive mode of operation. According to the invention, the same state, optionally restricted to a portion of the address amplifiers, is also made available for the test programming operation.

Thus, in the memory matrix shown in FIG. 2 two modes of operation can be distinguished, i.e.,:

1. During the "non-activated test mode" ($\overline{TEST}$=H), the $\overline{PD}$ signal in all address amplifiers, influences their output signals Aa or $\overline{Aa}$ (PD=H: Aa, $\overline{Aa}$ selectable); $\overline{PD}$=L; Aa=$\overline{Aa}$=L); and 2. During the "activated test mode" ($\overline{TEST}$=L), the $\overline{PD}$ signal is no longer capable of activating the address amplifiers Va3 and Va2. (Aa=$\overline{Aa}$=L).

The address amplifier Va1, however, is activated when $A_2^+$ is at the high level.

During the test mode, that is, when $\overline{TEST}$=L and $\overline{PD}$=H, therefore, $A_2^+$ determines the inactive or the active state of the address amplifier Va1. In the latter case, and according to the level of $A_1^+$, either A1 or $\overline{A1}$ is at the high level and, consequently, either the 50% even or the 50% odd row selecting lines of the row decoder are blocked.

The programmable bit pattern is alike along every selected row and corresponds to the data applied over the data lines and the possibly provided column/block decoders. Thus, for example, by one programming process, 50% of all rows, that is 50% of all bit positions can be programmed.

What is claimed is:

1. An electrically programmable memory matrix comprising:

a plurality of memory cells arranged in a matrix of "n" rows, the memory cells in each of said rows being coupled to one of a plurality of "n" row selecting lines, each of said row selecting lines controlling "m" memory cells;

a plurality of "a" row address circuits wherein $n=2^a$, each of said address circuits having an input terminal, first and second output terminals, and a control terminal, each address circuit being responsive to a first control signal level at said control terminal such that an address bit signal at said input terminal is coupled to said first output terminal and the complement of said address bit signal is applied to said second output terminal, each address circuit being responsive to a second control signal level at said control terminal such that said first and second output terminals are maintained at the same output signal level;

a row decoder having "n" outputs, and "a" pairs of input terminals, each of said row decoder outputs being coupled to one of said row selecting lines and each pair of input terminals being coupled to one of said row address circuits with one terminal of said pair of input terminals being coupled to said first output terminal and the other terminal of said pair of input terminals being coupled to said second output terminal, said row decoder being operable to supply a ground potential, a supply potential or a programming potential to each of said row decoder outputs;

a control circuit having a first input for receiving a first mode control signal, a second input for receiving a test control signal, a first output coupled to the control terminal of one of said address circuits, a second output coupled to the control terminals of the remaining ones of said address circuits, and a third input coupled to the input terminal of one of said remaining ones of said address circuits, said control circuit being responsive to a first test signal level at said control circuit first input and a first activating signal level at said control circuit second input such that said first control signal level is generated at said first and second control signal outputs, said control circuit being responsive to said first test signal level at said control circuit first input and a second activating signal level at said control circuit second input such that said second control signal level is generated at said first and second control signal outputs, said control circuit being responsive to a second test signal level at said control circuit first input such that said second control signal level is generated at said second control signal output and the signal level at said first control signal output is determined by the signal level at said third input.

2. An electrically programmable memory matrix in accordance with claim 1, wherein said control circuit comprises:
a first logic gate having a first input coupled to said control circuit first input, a second input coupled to said control circuit second input, and an output coupled to said control circuit second output;
a second logic gate having a first input coupled to said control circuit first input, a second input coupled to said control circuit third input, and an output; and,
a third logic gate having a first input coupled to said control circuit second input, a second input coupled to said second logic gate output, and an output coupled to said control circuit first output.

3. An electrically programmable memory matrix in accordance with claim 2, wherein:
said first logic gate is an "AND" gate;
said second logic gate is an "OR" gate; and,
said third logic gate is an "AND" gate.

4. An electrically programmable memory matrix in accordance with claim 1 wherein said plurality of memory cells are arranged in a plurality of "m" columns, each of said columns being controlled by one of a plurality of "w" column selecting lines,
a plurality of "b" column address circuits wherein $w = 2^b$, each of said column address circuits having an input terminal, first and second output terminals, and a control terminal, each column address circuit being responsive to said first control signal level at said control terminal such that an address bit signal at said input terminal is coupled to said first output terminal and the complement of said address bit signal is applied to said second output terminal, each column address circuit being responsive to said second control signal level at said control terminal such that said first and second output terminals are mounted at the same output signal level;
a column decoder having "w" outputs, and "b" pairs of input terminals, each of said column decoder outputs being coupled to one of said column selecting lines and, each pair of input terminals of said column decoder being coupled to one of said column address circuits with one terminal of said pair of input terminals of said column decoder being coupled to said column decoder first output terminal and the other terminal of said pair of input terminals of said column decoder being coupled to said column decoder second output terminal, said column decoder being operable to supply a ground potential, a supply potential or a programming potential to each of said column decoder outputs; and,
said control circuit first output being coupled to the control terminal of one of said column address circuits and said control circuit second output being coupled to the control terminals of the remaining ones of said column address circuits.

5. An electrically programmable memory matrix in accordance with claim 4, wherein said control circuit comprises:
a first logic gate having a first input coupled to said control circuit first input, a second input coupled to said control circuit second input and an output coupled to said control circuit second output;
a second logic gate having a first input coupled to said control circuit first input, a second input coupled to said control circuit third input, and an output; and
a third logic gate having a first input coupled to said control circuit second input, a second input coupled to said second logic gate output, and an output coupled to said control circuit first output.

6. An electrically programmable memory matrix in accordance with claim 5, wherein:
said first logic gate is an "AND" gate;
said second logic gate is an "OR" gate; and,
said third logic gate is an "AND" gate.

7. An electrically programmable memory matrix in accordance with claim 1 wherein said plurality of memory cells are arranged in a plurality of "m" columns, each of said columns being controlled by one of a plurality of "w" column selecting lines;
a plurality of "b" column address circuits wherein $w = 2^b$, each of said column address circuits having an input terminal, first and second output terminals, and a control terminal, each column address circuit being responsive to said first control signal level at said control terminal such that an address bit signal at said input terminal is coupled to said first output terminal and the complement of said address bit signal is applied to said second output terminal, each column address circuit being response to said second control signal level at said control terminal such that said first and second output terminals are mounted at the same output signal level;
a column decoder having "w" outputs, and "b" pairs of input terminals, each of said column decoder outputs being coupled to one of said column selecting lines and, each pair of input terminals of said column decoder being coupled to one of said column address circuits with one terminal of said pair of input terminals of said column decoder being coupled to said column decoder first output terminal and the other terminal of said pair of input terminal of said column decoder being coupled to said column decoder second output terminal, said column decoder being operable to supply a ground potential, a supply potential or a programming potential to each of said column decoder outputs; and
said control circuit second output being coupled to the control terminals of all of said column address circuits.

8. An electrically programmable memory matrix in accordance with claim 7, wherein said control circuit comprises:
a first logic gate having a first input coupled to said control circuit first input, a second input coupled to said control circuit second input, and an output coupled to said control circuit second output;
a second logic gate having a first input coupled to said control circuit first input, a second input coupled to said control circuit third input, and an output; and, a third logic gate having a first input coupled to said control circuit second input, a second input coupled to said second logic gate output, and an output coupled to said control circuit first output.

9. An electrically programmable memory matrix in accordance with claim 8, wherein:
   said first logic gate is an "AND" gate;
   said second logic gate is an "OR" gate; and
   said third logic gate is an "AND" gate.

* * * * *